(12) United States Patent
Ozawa

(10) Patent No.: US 7,199,425 B2
(45) Date of Patent: Apr. 3, 2007

(54) NON-VOLATILE MEMORY CELLS

(75) Inventor: Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 10/770,579

(22) Filed: Feb. 4, 2004

(65) Prior Publication Data

US 2004/0238881 A1    Dec. 2, 2004

(30) Foreign Application Priority Data

May 26, 2003    (JP)    ............................. 2003-148132

(51) Int. Cl.
*H01L 29/788* (2006.01)
(52) U.S. Cl. ................ 257/317; 257/316; 257/E29.129
(58) Field of Classification Search ................ 257/315, 257/316, 317, E29.129
See application file for complete search history.

(56) References Cited

U.S. PATENT DOCUMENTS

| | | | | |
|---|---|---|---|---|
| 6,943,403 | B2 * | 9/2005 | Park | ............................ 257/317 |
| 2004/0119110 | A1 * | 6/2004 | Park | ............................ 257/315 |
| 2005/0023599 | A1 * | 2/2005 | Song | ............................ 257/315 |

FOREIGN PATENT DOCUMENTS

| JP | 64-89372 | 4/1989 |
|---|---|---|
| JP | 3-34577 | 2/1991 |
| JP | 2579954 | 11/1996 |
| JP | 8-330450 | 12/1996 |
| JP | 9-8157 | 1/1997 |
| JP | 9-97850 | 4/1997 |
| JP | 9-167807 | 6/1997 |
| JP | 09-298247 | 11/1997 |
| JP | 11-67940 | 3/1999 |
| JP | 11-163304 | 6/1999 |
| JP | 2002-057228 | 2/2002 |
| JP | 2002-110830 | 4/2002 |
| JP | 2002-203919 | 7/2002 |

OTHER PUBLICATIONS

Lee, J. D. et al., "Effects of Floating-Gate Interference on NAND Flash Memory Cell Operation", IEEE Electronic Device Letters, vol. 23, No. 5, pp. 264-266, (Mary 2002).
Notification of Reasons for Rejection issued by Japanese Patent Office, mailed Jul. 5, 2005, for Japanese Patent Application No. 2003-148132, and English-language translation thereof.

* cited by examiner

*Primary Examiner*—Ngân V. Ngô
(74) *Attorney, Agent, or Firm*—Finnegan, Henderson, Farabow, Garrett & Dunner, L.L.P.

(57) ABSTRACT

A semiconductor device comprises a semiconductor substrate, and a non-volatile memory cell provided on the semiconductor substrate, the non-volatile memory cell comprising a tunnel insulating film provided on the semiconductor substrate, a floating gate electrode provided on the tunnel insulating film, the width of the floating gate electrode changing in the height direction of the non-volatile memory cell in channel width or length direction there, and being thinnest between a region above the bottom surface of the floating gate electrode and a region below the upper surface thereof, a control gate electrode above the floating gate electrode, and an interelectrode insulating film provided between the control gate electrode and the floating gate electrode.

13 Claims, 15 Drawing Sheets

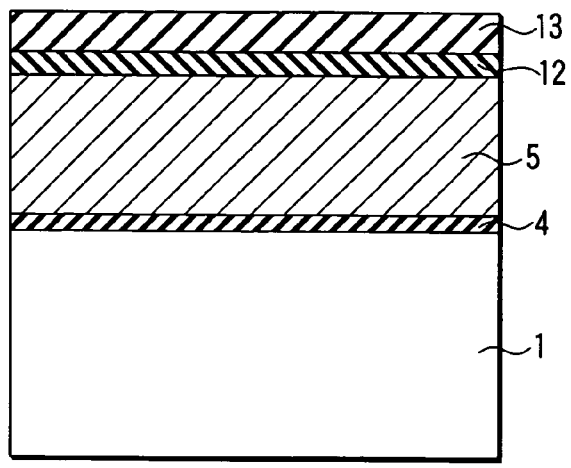
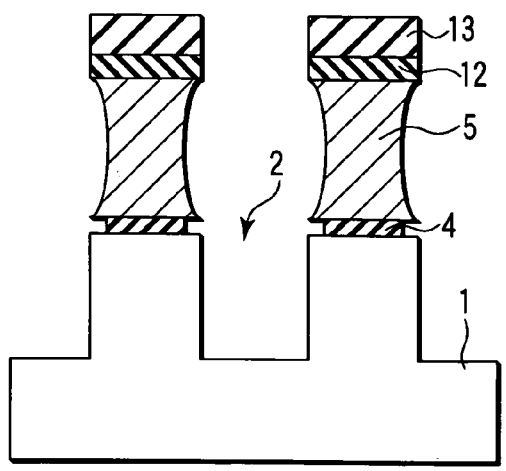
FIG. 11A  FIG. 11B
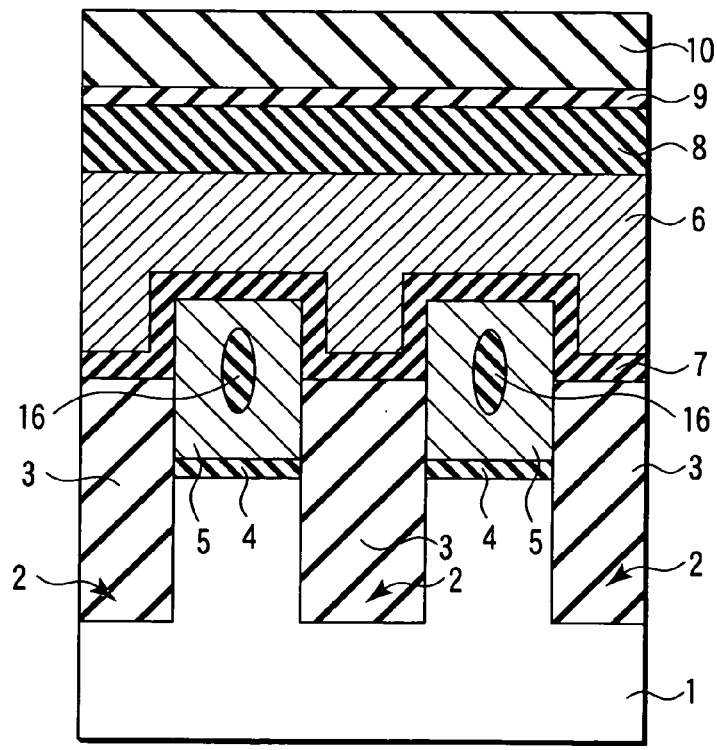
FIG. 12

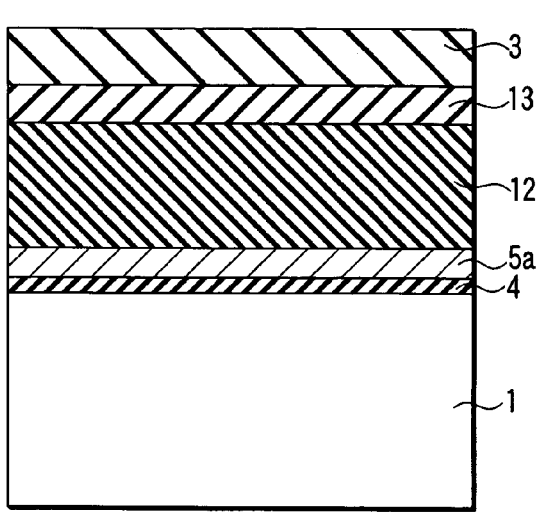 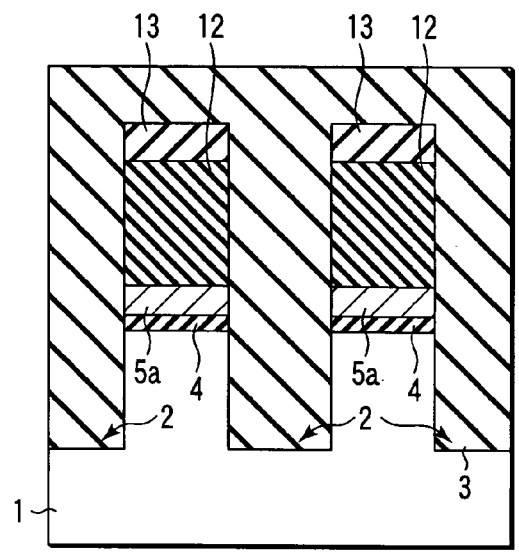
F I G. 13A   F I G. 13B
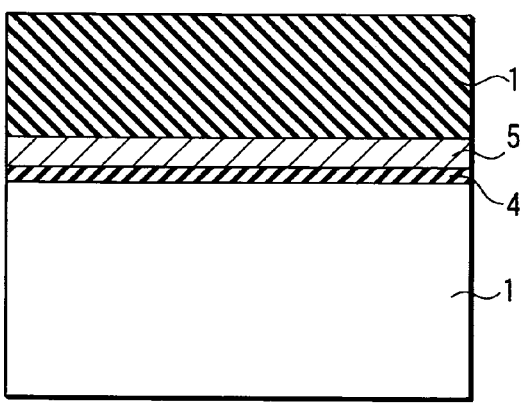 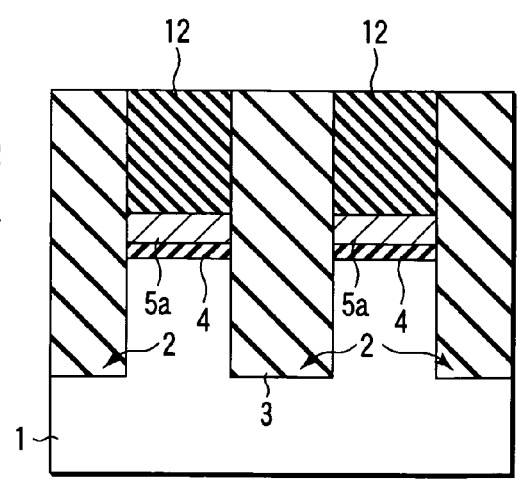
F I G. 14A   F I G. 14B

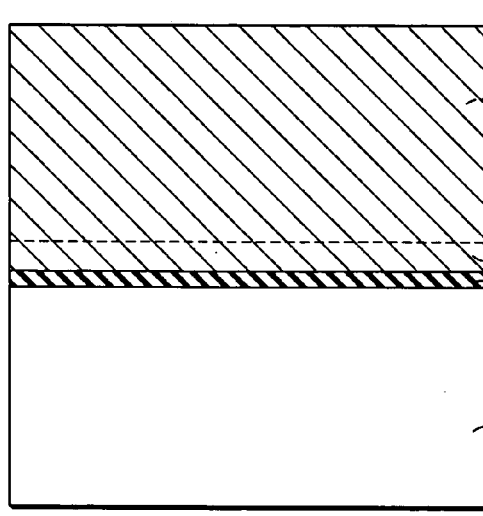
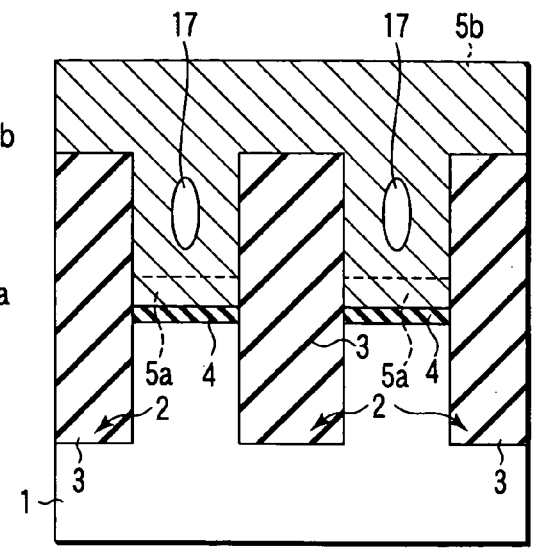
F I G. 15A    F I G. 15B
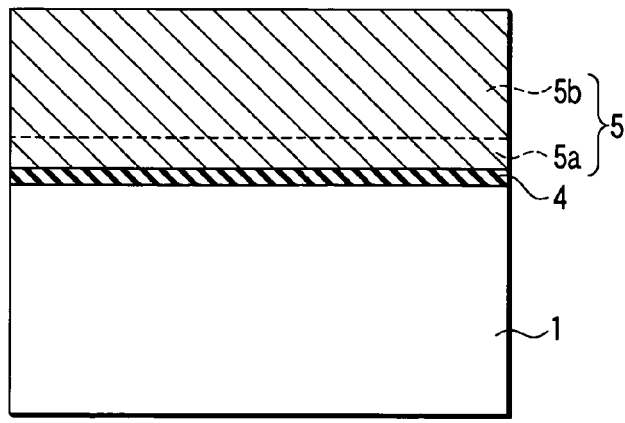
F I G. 16A
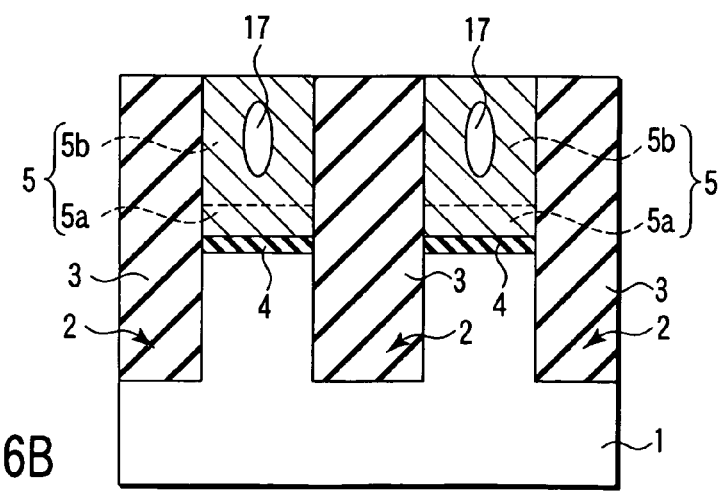
F I G. 16B

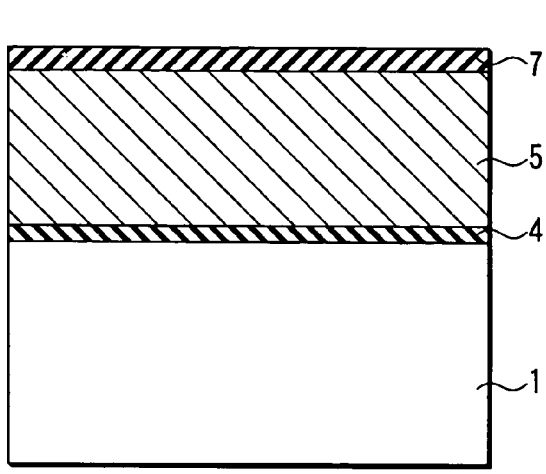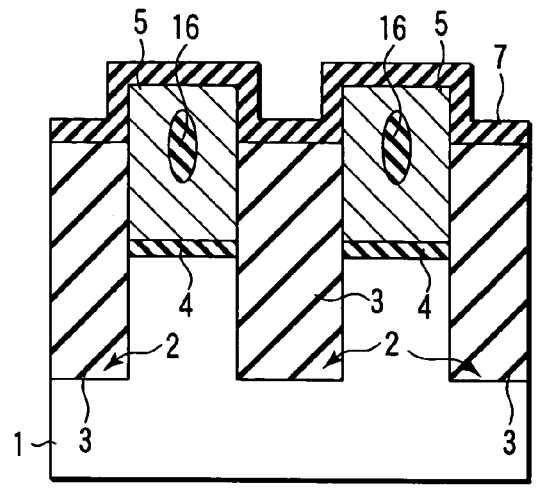
FIG. 17A  FIG. 17B
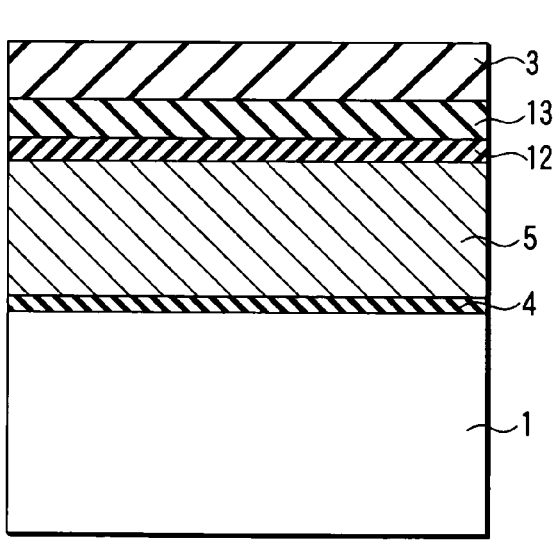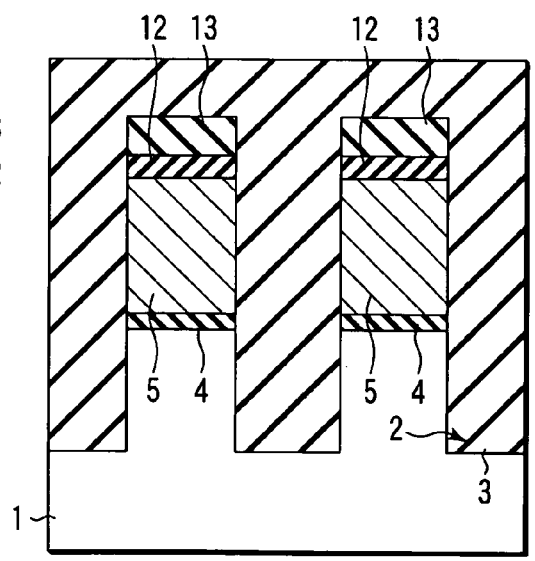
FIG. 19A  FIG. 19B

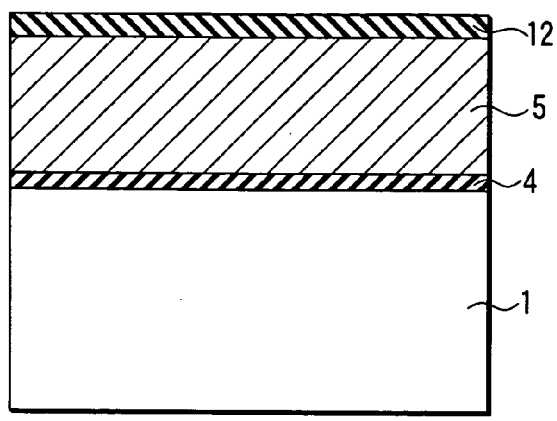
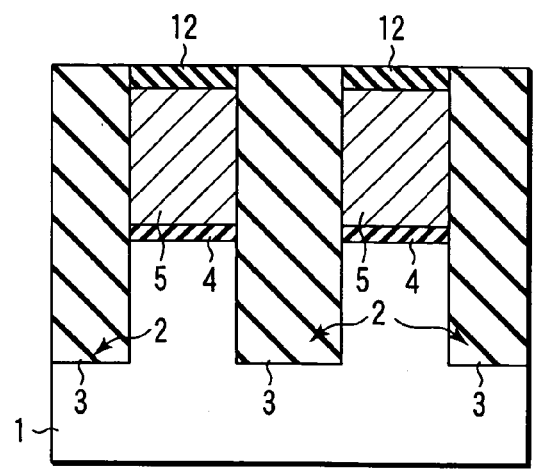
FIG. 20A               FIG. 20B
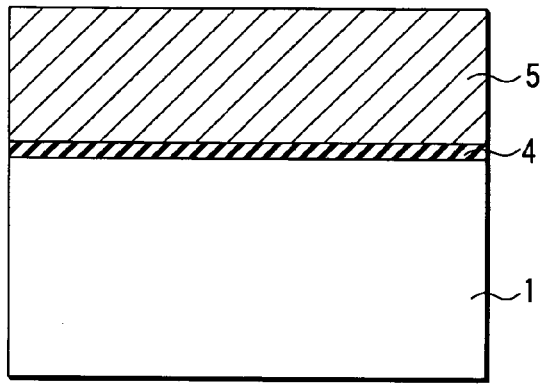
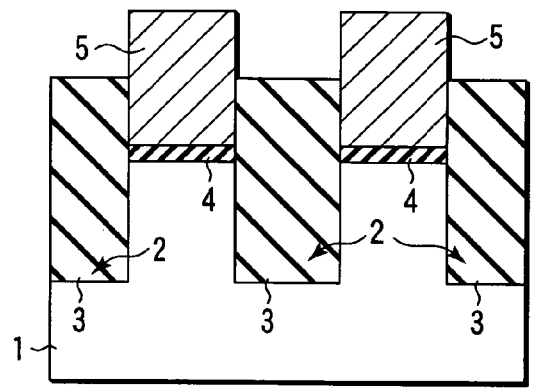
FIG. 21A               FIG. 21B
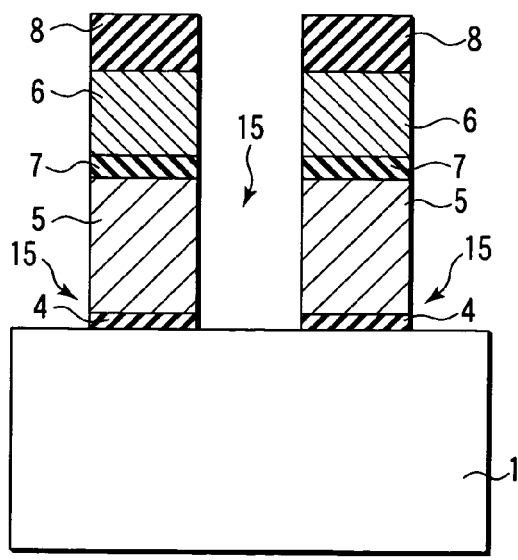
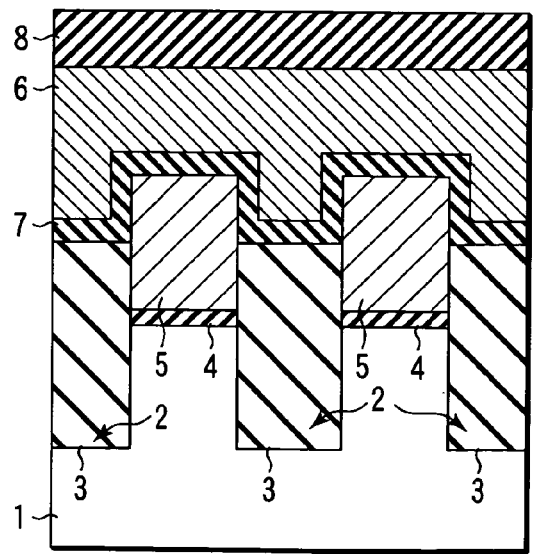
FIG. 22A               FIG. 22B

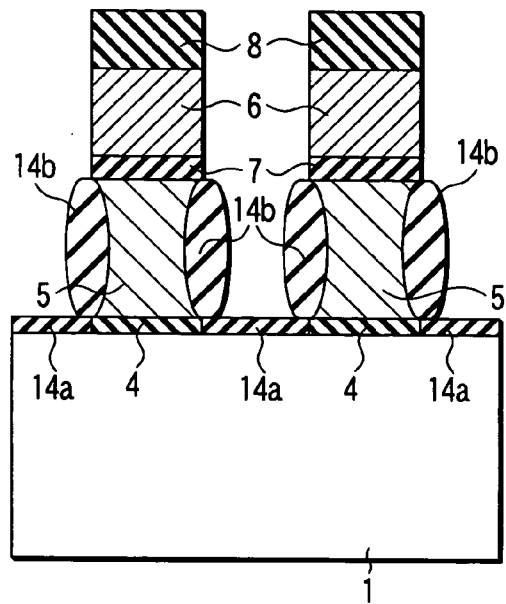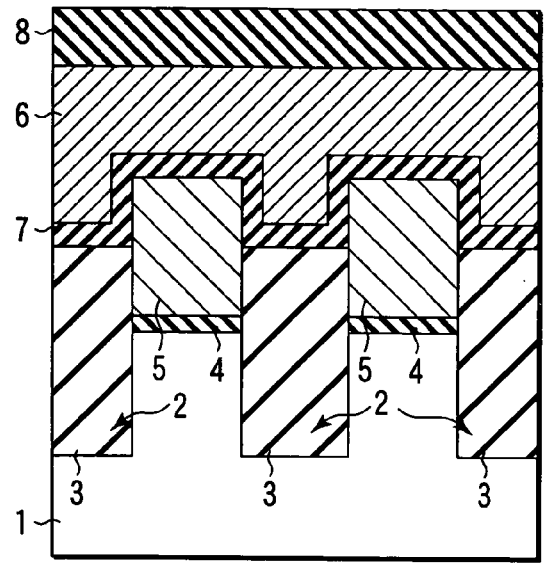
FIG. 23A  FIG. 23B
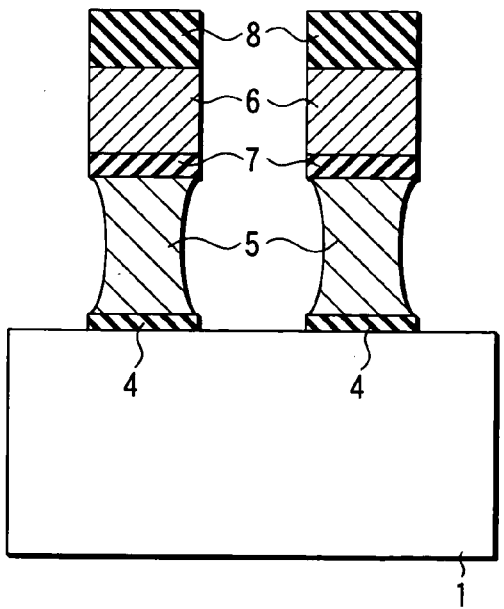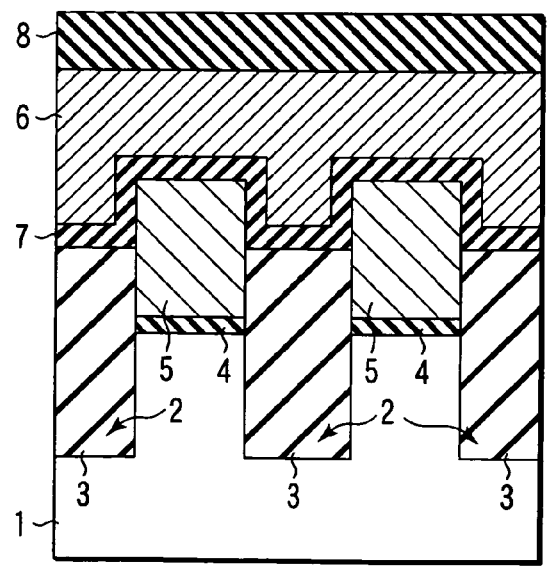
FIG. 24A  FIG. 24B

NON-VOLATILE MEMORY CELLS

CROSS-REFERENCE TO RELATED APPLICATIONS

This application is based upon and claims the benefit of priority from the prior Japanese Patent Application No. 2003-148132, filed May 26, 2003, the entire contents of which are incorporated herein by reference.

BACKGROUND OF THE INVENTION

1. Field of the Invention

The present invention relates to a semiconductor device including a non-volatile memory cell, and to a method of manufacturing the same.

2. Description of the Related Art

FIG. 29 shows the cross-sectional structure of a plurality of conventional non-volatile memory cells in a channel width direction (i.e., direction perpendicular to channel current flowing direction) (see IEEE ELECTRON DEVICE LETTERS, VOL. 23, NO. 5, MAY 2002, p 264–266). In FIG. 29, reference numerals 81, 82, 83, 84, 85 and 86 denote silicon substrate, isolation film, tunnel insulating film, floating gate electrode, interelectrode insulating film and control gate electrode, respectively.

As seen from FIG. 29, most of two adjacent floating gate electrodes in the channel width direction (about 50% in the example shown in FIG. 29) face via the isolation film 82.

The scale-down of memory cell further advances, and thereby, a distance L1 between floating gate electrodes 84 becomes shorter. The shorter the distance L1 becomes, the larger the capacitance between adjacent floating gate electrodes (parasitic capacitance between floating gate electrodes) becomes.

As a result, since the scale-down of memory cell is now advancing, the parasitic capacitance between floating gate electrodes must be considered as well as the parasitic capacitance between the floating gate electrode 84 and the silicon substrate 81.

An increase of the parasitic capacitance between floating gate electrodes causes a cell interference. According to the cell interference, write/erase state of adjacent memory cells gives influence to memory cell operation characteristic. The cell interference is a factor of causing memory malfunction.

The following is a description on another problem in conventional non-volatile memory cells.

FIG. 30 shows the cross-sectional structure of a plurality of conventional non-volatile memory cells in a channel length direction (channel current flowing direction) (see JPN. PAT. APPLN. KOKAI Publication No. 2002-203919). In FIG. 30, reference numerals 87 and 88 denote source/drain region and interlayer insulating film, respectively. In FIG. 30, the same reference numerals as FIG. 29 are used to designate portions corresponding to FIG. 29.

As seen from FIG. 30, two adjacent floating gate electrodes 84 in the channel length direction entirely face each other via the interlayer insulating film 88.

The scale-down of memory cell further advances, and thereby, a distance L2 between floating gate electrodes 84 becomes shorter. The shorter the distance L2 becomes, the larger parasitic capacitance C1 between upper surfaces of adjacent floating gate electrodes 84 shown in FIG. 31A becomes.

As a result, since the scale-down of memory cell is now advancing, the parasitic capacitance C1 must be considered in addition to parasitic capacitance C2 between sidewalls of adjacent floating gate electrodes 84 (see FIG. 31B). In particular, the parasitic capacitance C1 remarkably increases if high dielectric constant films such as alumina film or tantalum oxide film are used as the interelectrode insulating film 85.

The increase of the parasitic capacitance C1 causes cell interference. The cell interference is a factor of causing memory malfunction.

BRIEF SUMMARY OF THE INVENTION

According to an aspect of the present invention, there is provided a semiconductor device comprising: a semiconductor substrate; and a non-volatile memory cell provided on the semiconductor substrate, the non-volatile memory cell comprising: a tunnel insulating film provided on the semiconductor substrate; a floating gate electrode provided on the tunnel insulating film, the width of the floating gate electrode changing in the height direction of the non-volatile memory cell in channel width or length direction there, and being thinnest between a region above the bottom surface of the floating gate electrode and a region below the upper surface thereof; a control gate electrode above the floating gate electrode; and an interelectrode insulating film provided between the control gate electrode and the floating gate electrode.

According to another aspect of the present invention, there is provided a semiconductor device comprising: a semiconductor substrate; and a non-volatile memory cell provided on the semiconductor substrate, the non-volatile memory cell comprising: a tunnel insulating film provided on the semiconductor substrate; a floating gate electrode provided on the tunnel insulating film; a control gate electrode above the floating gate electrode; and an interelectrode insulating film provided between the control gate electrode and the floating gate electrode, the interelectrode insulating film including a first dielectric region and a second dielectric region having permittivity lower than the first dielectric region, the second dielectric region being provided on a edge of the first dielectric region in the channel length direction of the non-volatile memory cell.

According to another aspect of the present invention, there is provided a semiconductor device comprising: a semiconductor substrate; and a non-volatile memory cell provided on the semiconductor substrate, the non-volatile memory cell comprising: a tunnel insulating film provided on the semiconductor substrate; a floating gate electrode provided on the tunnel insulating film, and including at least one of an empty space region and insulator region; a control gate electrode above the floating gate electrode; and an interelectrode insulating film provided between the control gate electrode and the floating gate electrode.

According to an aspect of the present invention, there is provided a method of manufacturing a semiconductor device comprising: a semiconductor substrate; an isolation region provided on a surface of the semiconductor and including an isolation trench; and a non-volatile memory cell provided on the semiconductor substrate, the non-volatile memory cell comprising: a tunnel insulating film; a floating gate electrode provided on the tunnel insulating film, a control gate electrode above the floating gate electrode; and an interelectrode insulating film provided between the control gate electrode and the floating gate electrode, the method comprising: forming an insulating film to be processed into the tunnel insulating film on the semiconductor substrate; forming a semiconductor film to be processed into the floating gate electrode on the insulating film, the semiconductor film including a side where oxidation rate is the highest between a region above a bottom surface of the semiconductor film and a region below an upper surface thereof; etching the semiconductor film, the insulating film and the semiconductor substrate, and forming the isolation trench; oxidizing a surface of the semiconductor film exposed in a process of forming the isolation trench, and forming an oxide film on the surface of the semiconductor film; and removing the oxide film.

According to another aspect of the present invention, there is provided a method of manufacturing a semiconductor device comprising: a semiconductor substrate; an isolation region provided on a surface of the semiconductor and including an isolation trench; and a non-volatile memory cell provided on the semiconductor substrate, the non-volatile memory cell comprising: a tunnel insulating film; a floating gate electrode provided on the tunnel insulating film, a control gate electrode above the floating gate electrode; and an interelectrode insulating film provided between the control gate electrode and the floating gate electrode, the method comprising: forming an insulating film to be processed into the tunnel insulating film and a semiconductor film to be processed into the floating gate electrode on the semiconductor substrate successively; etching the semiconductor film, the insulating film and the semiconductor substrate, and forming the isolation trench; forming an isolation film in the isolation trench; forming a first dielectric region making a part of the interelectrode insulating film and the control gate electrode on a region including the isolation film and the semiconductor film successively; and forming a second dielectric region having permittivity lower than the first dielectric region and making a part of the interelectrode insulating film in an empty space region formed by etching an exposed surface of the first dielectric region by a predetermined amount in the lateral direction.

According to another aspect of the present invention, there is provided a method of manufacturing a semiconductor device comprising: a semiconductor substrate; an isolation region provided on a surface of the semiconductor and including an isolation trench; and a non-volatile memory cell provided on the semiconductor substrate, the non-volatile memory cell comprising: a tunnel insulating film; a floating gate electrode provided on the tunnel insulating film, and including at least one of an empty space region and insulator region; a control gate electrode above the floating gate electrode; and an interelectrode insulating film provided between the control gate electrode and the floating gate electrode, the method comprising: forming an insulating film to be processed into the tunnel insulating film, a first semiconductor film making a part of the floating gate electrode, and a polishing stopper film on the semiconductor substrate successively; etching the first semiconductor film, the insulating film, the semiconductor substrate and the polishing stopper film, forming the isolation trench; forming an isolation film on a region including the isolation trench and the polishing stopper film so that the isolation trench is filled; polishing the surface of the isolation trench using the polishing stopper film as a stopper, and removing the isolation film outside the isolation trench; removing the polishing stopper film; and forming a second semiconductor film making a part of the floating gate electrode and including an empty space therein on a region including the isolation film and the first semiconductor film to fill a concave portion formed by removing the polishing stopper film.

BRIEF DESCRIPTION OF THE SEVERAL VIEWS OF THE DRAWING

FIG. 11A and FIG. 11B are cross-sectional views showing the process of manufacturing a plurality of memory cells according to the third embodiment;

FIG. 12 is a channel width direction cross-sectional view showing a plurality of memory cells according to the fourth embodiment of the present invention;

FIG. 13A and FIG. 13B are cross-sectional views showing the process of manufacturing a plurality of memory cells according to the fourth embodiment;

FIG. 14A and FIG. 14B are cross-sectional views showing the process of manufacturing the memory cells following FIG. 13A and FIG. 13B, respectively;

FIG. 15A and FIG. 15B are cross-sectional views showing the process of manufacturing the memory cells following FIG. 14A and FIG. 14B, respectively;

FIG. 16A and FIG. 16B are cross-sectional views showing the process of manufacturing the memory cells following FIG. 15A and FIG. 15B, respectively;

FIG. 17A and FIG. 17B are cross-sectional views showing the process of manufacturing the memory cells following FIG. 16A and FIG. 16B, respectively;

FIG. 19A and FIG. 19B are cross-sectional views showing the process of manufacturing the memory cells of the fifth embodiment;

FIG. 20A and FIG. 20B are cross-sectional views showing the process of manufacturing the memory cells following FIG. 19A and FIG. 19B, respectively;

FIG. 21A and FIG. 21B are cross-sectional views showing the process of manufacturing the memory cells following FIG. 20A and FIG. 20B, respectively;

FIG. 22A and FIG. 22B are cross-sectional views showing the process of manufacturing the memory cells following FIG. 21A and FIG. 21B, respectively;

FIG. 23A and FIG. 23B are cross-sectional views showing the process of manufacturing the memory cells following FIG. 22A and FIG. 22B, respectively;

FIG. 24A and FIG. 24B are cross-sectional views showing the process of manufacturing the memory cells following FIG. 23A and FIG. 23B, respectively;

DETAILED DESCRIPTION OF THE INVENTION

Embodiments of the present invention will be described below with reference to the accompanying drawings.

(First Embodiment)

Figure 1:
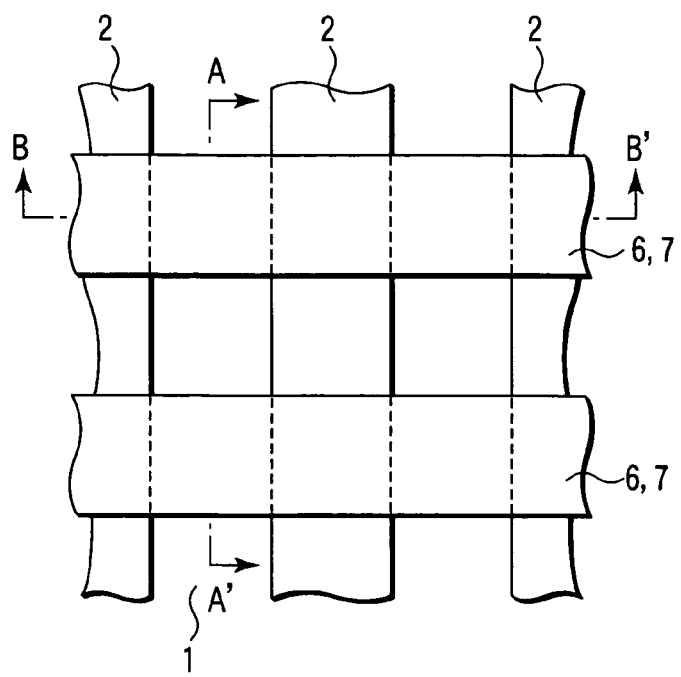
FIG. 1 is a plan view showing a plurality of memory cells according to the first embodiment of the present invention.
Figure 2A:
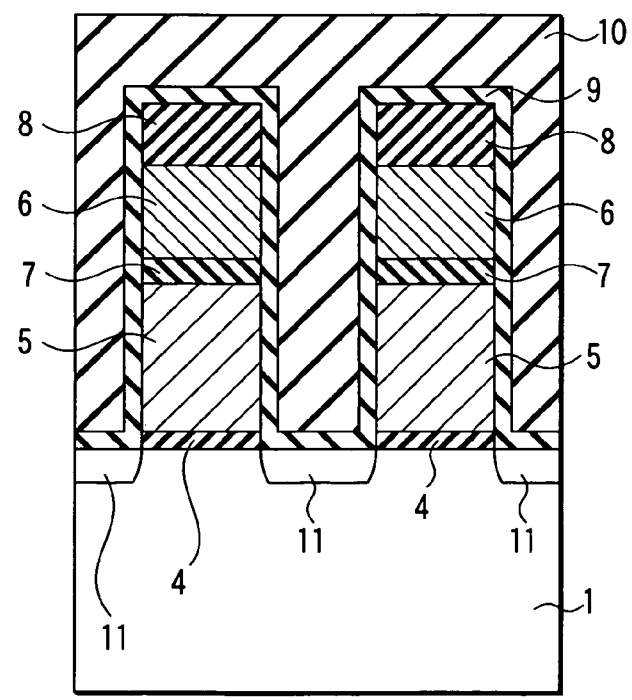
FIG. 2A and FIG. 2B are cross-sectional views taken along lines A–A' and B–B' shown in the plan view of FIG. 1, respectively.
Figure 2B:
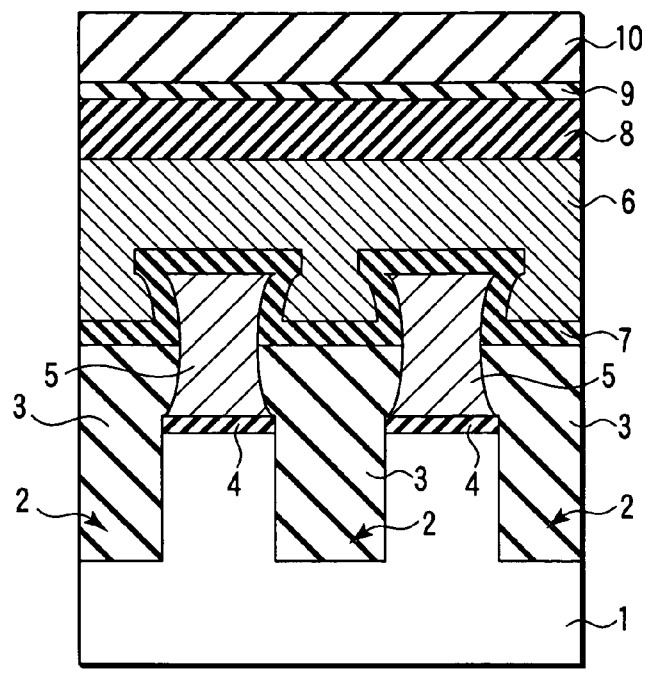

FIG. 1 is a plan view showing a plurality of non-volatile memory cells (hereinafter, referred simply to as memory cell) according to the first embodiment of the present invention. FIG. 2A is a cross-sectional view (in channel length direction) taken along a line A–A' of FIG. 1, and FIG. 2B is a cross-sectional view (in channel width direction) taken along a line B–B' thereof.

A memory cell array of a non-volatile memory comprises a plurality of memory cells. Each memory cell includes tunnel insulating film, floating gate electrode, interelectrode insulating film and source/drain regions. The memory cell of the present embodiment will be described below.

The surface of a silicon substrate 1 is provided with an isolation trench 2, which is filled with an isolation film 3. The upper surface of each isolation film 3 is higher than the surface of the silicon substrate 1, and lower than the upper surface of the floating gate electrode 5. More specifically, the upper surface of the isolation film 3 reaches about half of the height of the floating gate electrode 5.

An isolation region comprises the isolation trench 2 and the isolation film 3. The isolation region defines a semiconductor region (element forming region) of the silicon substrate 1 including a channel region of the memory cell.

The surface of the semiconductor region is provided with a tunnel insulating film 4. The floating gate electrode 5 is provided on the tunnel insulating film 4.

In the channel width direction of the memory cell, the width of the floating gate electrode 5 changes in the height direction of the memory cell and the width becomes thinnest at the approximately intermediate position between a region above the bottom surface of the floating gate electrode 5 and a region below the upper surface thereof.

The position where the width of the floating gate electrode 5 becomes thinnest is not limited to the foregoing intermediate position. For example, the position may be located near to the upper surface of the floating gate electrode 5 from the intermediate position or near to the bottom surface from the intermediate.

The width of the floating gate electrode 5 non-linearly increases toward the upper and lower surfaces of the floating gate electrode from the position where the width becomes thinnest. However, the width may linearly increase.

The distance between the upper surfaces of adjacent floating gate electrodes 5 is the same as the distance between that of the conventional floating gate electrodes. The distance between the lower surfaces of adjacent floating gate electrodes 5 is the same as the distance between that of the conventional floating gate electrodes. Therefore, the average distance between adjacent floating gate electrodes 5 is longer than the distance between conventional floating gate electrodes.

When the average distance between adjacent floating gate electrodes 5 is longer, the parasitic capacitance between adjacent floating gate electrodes 5 is reduced. Therefore, according to the present embodiment, cell interference is effectively prevented even if the scale-down of element is advanced. As a result, it is possible to realize a high integration non-volatile memory, which is hard to cause memory malfunction.

A control gate electrode 6 is provided above the floating gate electrode 5. An interelectrode insulating film 7 is provided between the floating gate electrode 5 and the control gate electrode 6.

A silicon nitride film 8 is provided on the control gate electrode 6. The silicon nitride film 8 is used as RIE (Reactive Ion Etching) mask in the process of manufacturing the memory cell.

As shown in FIG. 2A, a gate structure portion comprises tunnel insulating film 4, floating gate electrode 5, control gate electrode 6, interelectrode insulating film 7 and silicon nitride film 8. The side and upper gate surface of the gate structure portion is coated with a silicon oxide film 9. Such a silicon oxide film 9 is called as an electrode sidewall oxide film.

A BPSG (Borophosphosilicate Glass) film 10 functioning as an interlayer insulating film is provided on the silicon oxide film 9. The surface of the silicon substrate 1 is provided with a pair of source/drain regions 11 and the gate structure portion 4 to 8 is sandwiched by the pair of source/drain regions 11.

The method of manufacturing a plurality of memory cells of the present embodiment will be described with reference to FIG. 3A and FIG. 3B to FIG. 8A and FIG. 8B. FIG. 3A to FIG. 8A are equivalent to cross-sectional views taken along a line A–A' of FIG. 1, and FIG. 3B to FIG. 8B are equivalent to cross-sectional views taken along a line and B–B' thereof.

Figures 3A, 3B:
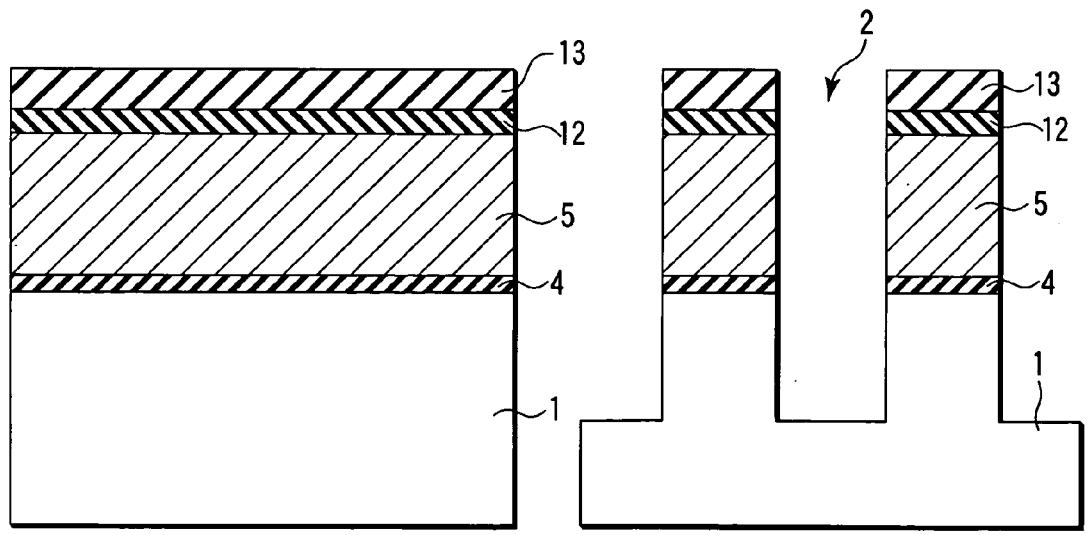
FIG. 3A and FIG. 3B are cross-sectional views showing the process of manufacturing a plurality of memory cells according to the first embodiment.

As shown in FIG. 3A and FIG. 3B, the tunnel insulating film 4 having a thickness of 10 nm is formed on the surface of the silicon substrate 1 doped with desired impurity by thermal oxidation. Thereafter, a polysilicon film 5 having a thickness of 150 nm and doped with phosphorus to be processed into the floating gate electrode is deposited on the tunnel insulating film 4. In this case, the polysilicon film 5 is deposited thereon by low-pressure CVD (Chemical Vapor Deposition) using silane ($SiH_4$) and phosphine (Ph3) gases.

The polysilicon film 5 has the following phosphorus concentration gradient (concentration distribution). More specifically, the phosphorus concentration is the highest at the approximately intermediate position of the thickness direction of the polysilicon film 5, and becomes gradually lower toward the upper and lower surfaces thereof.

The polysilicon film 5 having the phosphorus concentration gradient (concentration distribution) is obtained by controlling the flow rate of phosphine in the CVD process of the polysilicon film 5.

As illustrated in FIG. 3A and FIG. 3B, the following films are successively deposited on the polysilicon film 5 by low-pressure CVD process. One is a silicon nitride film 12 to be processed into the stopper for CMP (Chemical Mechanical Polish) and having a thickness of 50 nm. Another is a silicon oxide film 13 to be processed into an RIE mask and having a thickness of 100 nm.

As depicted in FIG. 3A and FIG. 3B, the silicon oxide film 13 is etched by RIE process using resist (not shown) covering the element forming region. By doing so, the resist pattern is transferred to the silicon oxide film 13.

As seen from FIG. 3A and FIG. 3B, silicon nitride film 12, polysilicon film 5 and tunnel insulating film 4 are successively etched by RIE process using the resist mask and the silicon oxide film 13 as the mask. The exposed region of the silicon substrate 1 is etched so that an isolation trench 2 having a depth of 150 nm can be formed. By doing so, the element forming region having a channel width of about 100 nm is obtained, and the shape of the polysilicon film (floating gate electrode) 5 is determined in the bit line direction.

The resist disappears in the RIE process, thereafter; the silicon oxide film 13 is used as the RIE mask.

Figure 4A:
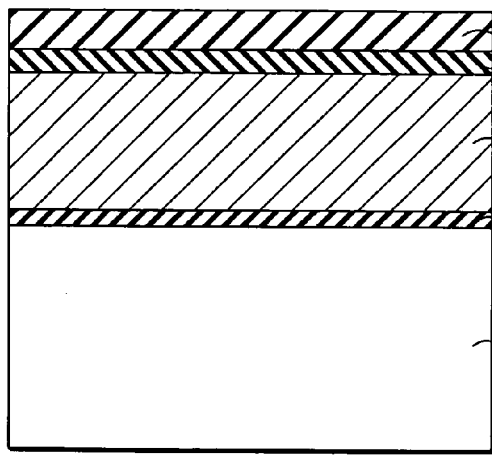
FIG. 4A and FIG. 4B are cross-sectional views showing the process of manufacturing the memory cells following FIG. 3A and FIG. 3B, respectively.
Figure 4B:
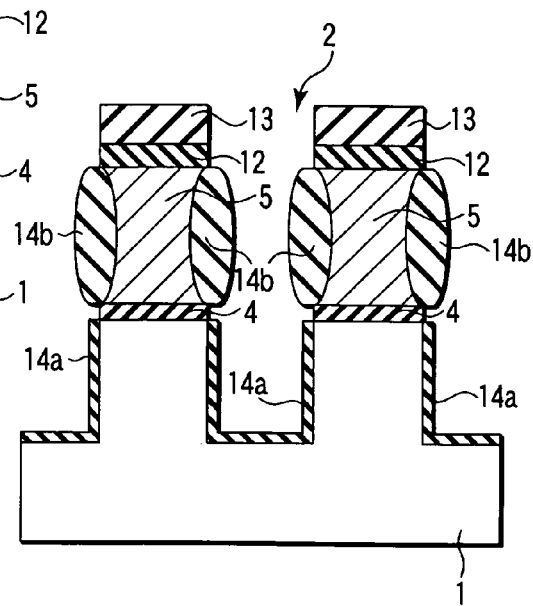

As shown in FIG. 4A and FIG. 4B, silicon oxide films 14a and 14b are formed on the surface of the exposed silicon substrate 1 and the floating gate electrode 5 by thermal oxidation.

The silicon oxide film 14a on the surface of the silicon substrate 1 (bottom surface and side surface of isolation trench 2) has a thickness of 5 nm.

On the other hand, the silicon oxide film 14b on the sidewall of the polysilicon film 5 doped with phosphorus has the following film thickness distribution. The film thickness of the silicon oxide film 14b on the sidewall of the polysilicon film 5 doped with phosphorus becomes thicker as the concentration of the phosphorus increase, and the film 14b has a thickness of 10 nm at the highest phosphorus concentration, that is, the approximately intermediate position in the thickness direction.

The reason why the silicon oxide film 14b is formed having the film thickness distribution described above is because enhanced oxidation by phosphorus occurs on the sidewall of the polysilicon film 5.

Figure 5A:
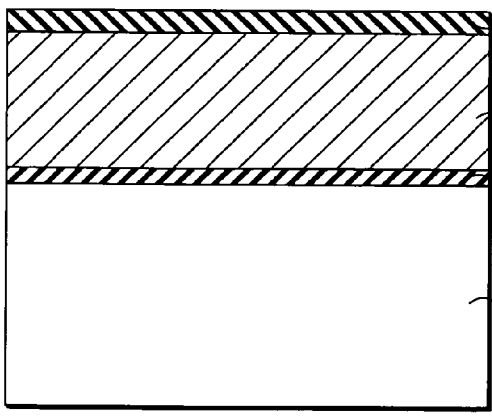
FIG. 5A and FIG. 5B are cross-sectional views showing the process of manufacturing the memory cells following FIG. 4A and FIG. 4B, respectively.
Figure 5B:
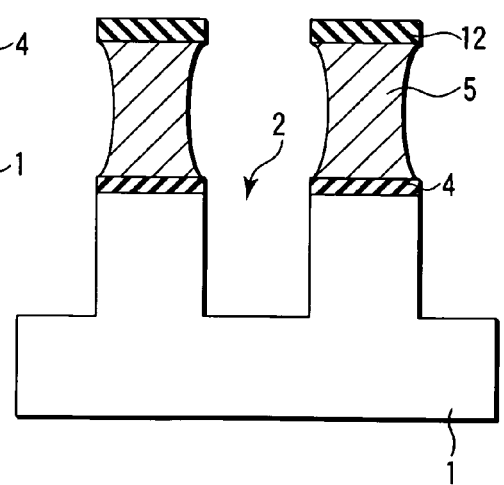

As illustrated in FIG. 5A and FIG. 5B, the silicon oxide films 14a and 14b are removed by wet etching using diluted hydrofluoric acid solution. The silicon oxide film 13 is also removed by the wet etching.

As a result, the floating gate electrode 5 is obtained having the following width in the channel width direction of the memory cell. Namely, the width becomes thinnest at the approximately intermediate position between a region above the bottom surface of the floating gate electrode 5 and a region below the upper surface thereof. In addition, the width non-linearly increases toward the upper and lower surfaces of the floating gate electrode 5 from the position where the width of the floating gate electrode 5 is minimum.

Next, a silicon oxide film (CVD oxide film) having a thickness of 400 nm which is to be processed into the isolation film 3 is deposited on the entire surface by plasma CVD so that the isolation trench 2 is fully filled.

Figure 6A:
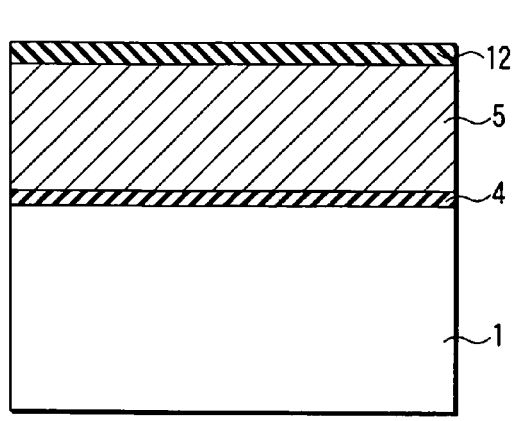
FIG. 6A and FIG. 6B are cross-sectional views showing the process of manufacturing the memory cells following FIG. 5A and FIG. 5B, respectively.
Figure 6B:
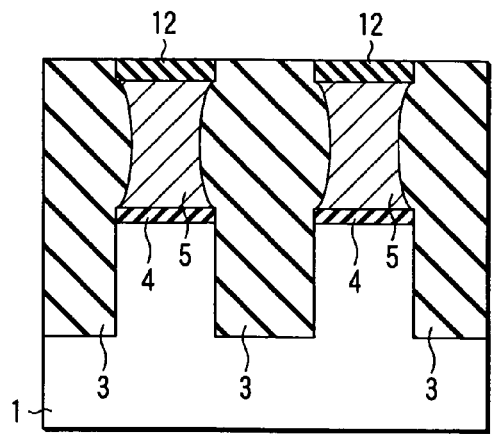

As depicted in FIG. 6A and FIG. 6B, unnecessary portions of the CVD oxide film are removed by CMP process using the silicon nitride film 12 as the CMP stopper. By doing so, the isolation film 3 having a predetermined shape is obtained. The CMP process is carried out until the silicon nitride film 12 is exposed and the surface is planarized.

Figure 7A:
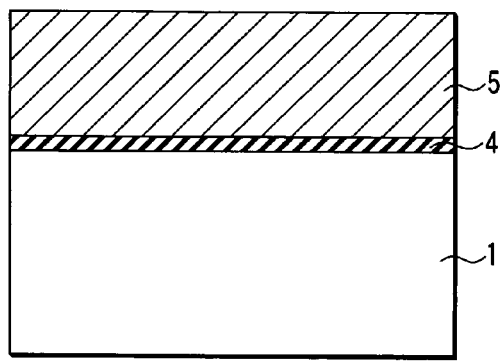
FIG. 7A and FIG. 7B are cross-sectional views showing the process of manufacturing the memory cells following FIG. 6A and FIG. 6B, respectively.
Figure 7B:
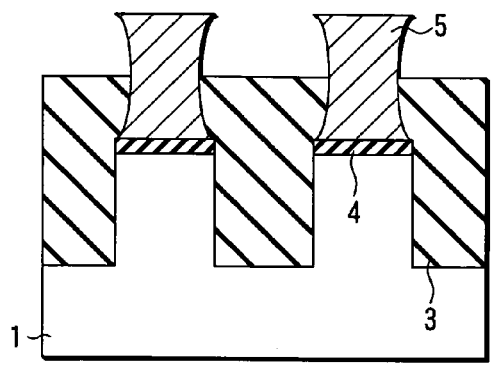

As seen from FIG. 7A and FIG. 7B, the silicon nitride film 12 is removed by etching using phosphoric acid solution. Thereafter, the upper portion of the isolation film (silicon oxide film) 3 is removed by wet etching using diluted hydrofluoric acid solution. By doing so, the upper portion of the side surface of the floating gate electrode 5 is exposed in the channel width direction. In this case, the height of the side of the floating gate electrode 5 is 70 nm.

Figure 8A:
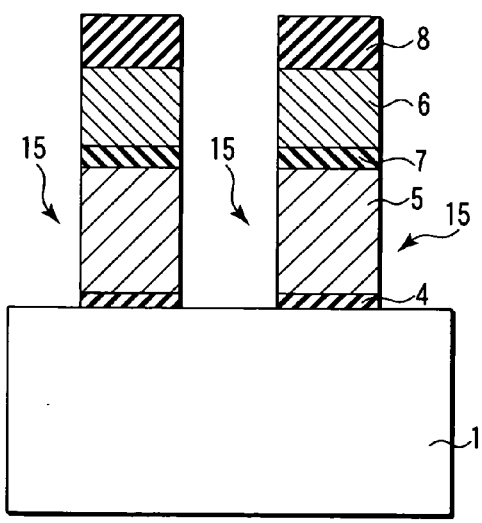
FIG. 8A and FIG. 8B are cross-sectional views showing the process of manufacturing the memory cells following FIG. 7A and FIG. 7B, respectively.
Figure 8B:
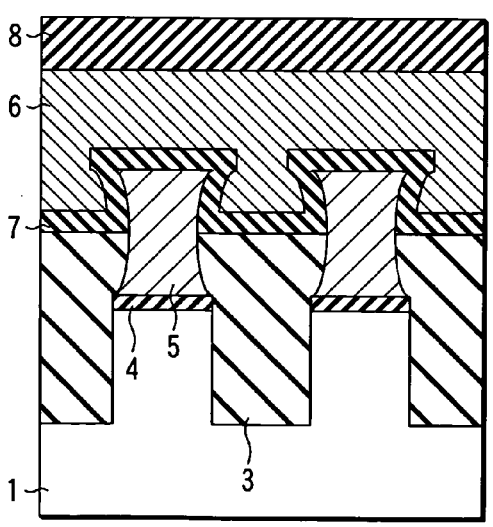

As shown in FIG. 8A and FIG. 8B, a three-layer structure insulating film having a thickness of 15 nm and including a silicon oxide film, a silicon nitride film and a silicon oxide film to be processed into the interelectrode insulating film 7 is deposited on the entire surface by low-pressure CVD process.

As illustrated in FIG. 8A and FIG. 8B, a two-layer structure conductive film having a thickness of 100 nm and including a polysilicon film and a tungsten silicide film to be processed into the control gate electrode 6 is deposited on the three-layer structure insulating film by low-pressure CVD process.

Next, a silicon nitride film to be processed into a RIE mask and having a thickness of 100 nm is formed on the two-layer structure conductive film by low-pressure CVD.

Next, resist mask is formed on the silicon nitride film, and the silicon nitride film is etched by RIE process using the resist mask as the mask. By doing so, the silicon nitride film (RIE mask) 8 having the pattern corresponding to the gate structure portion is obtained as seen from FIG. 8A and FIG. 8B.

Next, the foregoing films are successively etched by RIE process using the resist mask and the silicon nitride film 8 as the mask. The films are two-layer structure conductive film, three-layer structure insulating film, floating gate electrode 5 and tunnel insulating film 4. In this manner, a slit 15 is formed in the word line direction, as shown in FIG. 8A and FIG. 8B. By doing so, the shape of the floating gate electrode 5 and the control gate electrode 6 is defined.

Next, the silicon oxide film (electrode sidewall oxide film) 9 is formed using thermal oxidation and CVD process. The source/drain regions 11 are formed using ion implantation and annealing. The interlayer insulating film, that is, the BPSG film 10 is deposited by low-pressure CVD process. In this manner, the memory cell shown in FIG. 2A and FIG. 2B is obtained. Thereafter, well-known process such as interconnect layer forming process is carried out, and thus, a non-volatile memory is completed.

(Second Embodiment)

Figure 9:
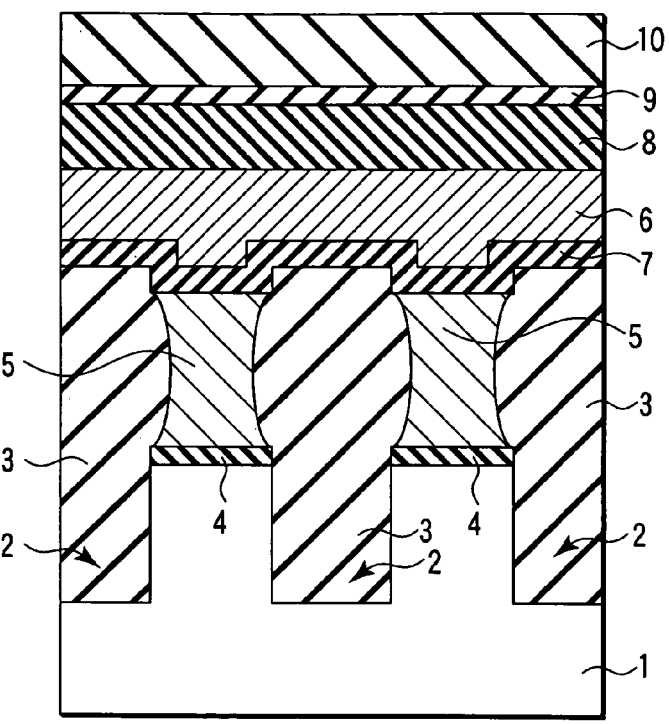
FIG. 9 is a channel width direction cross-sectional view showing a plurality of memory cells according to the second embodiment of the present invention.

FIG. 9 is a cross-sectional view showing a plurality of memory cells according to the second embodiment of the present invention. FIG. 9 is a channel width direction cross-sectional view corresponding to FIG. 2B. In FIG. 9, the same reference numerals as FIG. 2B are given to designate portions corresponding to FIG. 2B, and the details are omitted. The reference numerals identical to the preceding drawings show the identical or corresponding portion, and the details are omitted.

The second embodiment differs from the first embodiment in the following points. Of the upper surface and side of the floating gate electrode 5, the upper surface is coated with the interelectrode insulating film 7. In addition, the upper surface of the isolation film 3 is higher than that of the floating gate electrode 5.

According to the memory cell structure described above, no interelectrode insulating film 7 exists on the side surface of the floating gate electrode 5. Therefore, parasitic capacitance between adjacent floating gate electrodes 5 is about twice as much as the memory cell structure of the first embodiment. An increase of the parasitic capacitance is a factor of causing cell interference.

However, according to the memory cell structure of the present embodiment, the width of the floating gate electrode 5 becomes narrow at the approximately intermediate position in the height direction of the memory cell. Thus, the increase of the parasitic capacitance is prevented. As a result, the generation of memory malfunction by cell interference is greatly reduced.

The method of manufacturing a plurality of memory cells of the present embodiment is the same as that of the first embodiment except for the following point. Namely, the process of removing the upper portion of the isolation film 3 is omitted from the process of FIG. 7A and FIG. 7B. Therefore, according to the present embodiment, the following effect is obtained, that is, the process of manufacturing the memory cell is simplified.

(Third Embodiment)

Figure 10:
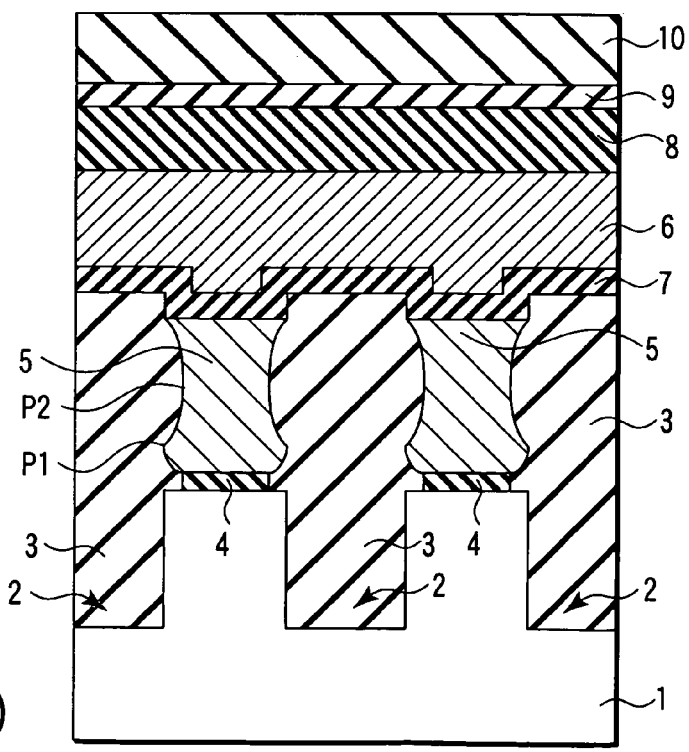
FIG. 10 is a channel width direction cross-sectional view showing a plurality of memory cells according to the third embodiment of the present invention.

FIG. 10 is a cross-sectional view showing a plurality of memory cells according to the third embodiment of the present invention. FIG. 10 is a channel width direction cross-sectional view corresponding to FIG. 2B.

The third embodiment differs from the first embodiment in the following points. Namely, the area of the tunnel insulating film 4 facing the floating gate electrode 5 is smaller than the area of the interelectrode insulating film 7 facing the floating gate electrode 5.

In addition, the width of the floating gate electrode 5 has the following distribution in the height direction of the memory cell. Namely, the floating gate electrode 5 has the maximum width at a position P1 separating from the bottom surface of the floating gate electrode 5 with a predetermined distance. In addition, the floating gate electrode 5 has the minimum width at a position P2 (position where the floating gate electrode 5 is thinnest) above the position P1.

According to the present embodiment, the following effect is obtained in addition to the effect described in the first embodiment. Namely, as the area of the tunnel insulating film 4 facing the floating gate electrode 5 is smaller than that of the interelectrode insulating film 7 facing the same, the reduction of operating voltage by an increase of coupling ratio is realize.

The coupling ratio is defined as Cie/(Ctd+Cie). In this case, Cie is capacitance of the interelectrode insulating film 7, and Ctd is capacitance of the tunnel insulating film 4.

The method of manufacturing a plurality of memory cells of the present embodiment slightly differs from that of the first embodiment.

The difference point between the present embodiment and the first embodiment is as follows. Time spent for wet etching using diluted hydrofluoric acid solution is made long in the process of FIG. 5A and FIG. 5B, and as seen from FIG. 11A and FIG. 11B, the edge of the tunnel insulating film 4 close to the isolation film 3 is etched by about 10 nm, and thereafter, thermal oxidation is carried out.

(Fourth Embodiment)

FIG. 12 is a cross-sectional view showing a plurality of memory cells according to the fourth embodiment of the present invention. FIG. 12 is a channel width direction cross-sectional view corresponding to FIG. 2B.

The fourth embodiment differs from the first to third embodiments in the following point. The floating gate electrode 5 is provided with a region including an empty space region or dielectric region (hereinafter, referred to as empty space/dielectric region) 16.

The width of the floating gate electrode 5 has no change in the height direction of the memory cell as well as channel length and width directions thereof. However, in this case, the width of the floating gate electrode 5 can be changed like the first or second embodiment.

According to the present embodiment, the floating gate electrode 5 is provided with the empty space/dielectric region 16. Thus, the cross-sectional area of the conductor portion of the floating gate electrode 5 becomes small. Therefore, this serves to reduce the parasitic capacitance between adjacent floating gate electrodes in the channel length direction. As a result, it is possible to realize a non-volatile memory, which can sufficiently reduce the generation of memory malfunction by memory cell interference.

In FIG. 12, there is shown a memory cell in which one floating gate electrode 5 is provided with one empty space/dielectric region 16. In this case, one floating gate electrode 5 may be provided with a plurality of empty space/dielectric regions 16. In addition, empty space region and dielectric region may be mixed in the floating gate electrode 5.

The method of manufacturing a plurality of memory cells of the fourth embodiment will be described with reference to FIG. 13A and FIG. 13B to FIG. 16A and FIG. 16B. FIG. 13A to FIG. 16A are equivalent to cross-sectional views taken along a line A–A' of FIG. 1, and FIG. 13B to FIG. 16B are equivalent to cross-sectional views taken along a line B–B' thereof.

As shown in FIG. 13A and FIG. 13B, the tunnel insulating film having a thickness of 10 nm is formed on the surface of the silicon substrate doped with desired impurity by thermal oxidation. Thereafter, the following films are successively deposited by low pressure CVD. One is a first polysilicon film 5a (first semiconductor film) having a thickness of 30 nm to be processed into a bottom-layer of a floating gate electrode. Another is a silicon nitride film 12 having a thickness of 150 nm to be processed into a CMP stopper. Another is a silicon oxide film 13 having a thickness of 100 nm to be processed into an RIE mask.

Next, as illustrated in FIG. 13A and FIG. 13B, the silicon oxide film 13 is etched by RIE process using resist (not shown) covering the element forming region as the mask. By doing so, the resist pattern is transferred to the silicon oxide film 13.

Subsequently, as depicted in FIG. 13A and FIG. 13B, silicon nitride film 12, polysilicon film 5a and tunnel insulating film 4 are successively etched by RIE process using the resist mask and the silicon oxide film 13 as the mask, further, the exposed region of the silicon substrate 1 is etched so that the isolation trench having a depth of 150 nm can be formed.

The resist disappears in the RIE process, and thereafter, the silicon oxide film 13 is used as the RIE mask.

As seen from FIG. 13A and FIG. 13B, a silicon oxide film (not shown) having a thickness of 5 nm is formed on the exposed silicon surface, thereafter, a silicon oxide film (CVD oxide film) having a thickness of 400 nm to be processed into the isolation film 3 is deposited on the entire surface by plasma CVD process so that the isolation trench 2 is fully filled.

Next as shown in FIG. 14A and FIG. 14B, unnecessary portions of the CVD oxide film are removed by CMP process using the silicon nitride film 12 as the stopper. By doing so, the isolation film 3 having a predetermined shape is obtained, and the silicon oxide film (RIE mask) 13 is removed. The CMP process is carried out until the silicon nitride film 12 is exposed and the surface is planarized.

Next as illustrated in FIG. 15A and FIG. 15B, the silicon nitride film 12 is removed by etching using phosphoric acid solution. Thereafter, a second polysilicon film 5b (second semiconductor film) having a thickness of 200 nm to be processed into a top-layer floating gate electrode 5 is deposited on the entire surface by low pressure CVD process.

In this case, the low pressure CVD process of the second polysilicon film 5b is carried out under the condition that the second polysilicon film 5b is formed conformaly. By doing so, the second polysilicon film 5b having an empty space region 17 called seam is formed. The empty space region 17 is positioned at the approximately center portion of a trench (concave) formed between adjacent isolation films 3. The trench (concave) is formed by removing the silicon nitride film 12.

Next, as depicted in FIG. 16A and FIG. 16B, the second polysilicon film 5b outside the trench (concave) between adjacent isolation films 3 is removed by CMP process and the surface of the region including the second polysilicon film 5b and the isolation film 3 is planarized. As a result, the floating gate electrode 5 comprising the first and second polysilicon films 5a and 5b is obtained.

Next, as seen from FIG. 17A and FIG. 17B, the upper portion of the isolation film (silicon oxide film) 3 is removed by wet etching using diluted hydrofluoric acid solution. Thereafter, the interelectrode insulating film 7 is formed on the isolation film 3 and the floating gate electrode 5.

The silicon oxide film making the interelectrode insulating film 7 is formed by thermal oxidation process. In this case, oxidation species diffuses into the second polysilicon film 5b, and reaches the empty space region 17. Thus, the empty space region 17 is converted into a silicon dioxide region, and thereby, a dielectric region is obtained as the empty space/dielectric region 16.

Incidentally, if the empty space region 17 is intactly left, an empty space region is obtained as the empty space/dielectric region 16. In addition, if part of the empty space region 17 is converted into a silicon dioxide region, empty space and dielectric regions are obtained as the empty space/dielectric region 16.

Thereafter, control gate electrode 6, silicon nitride film 8, silicon oxide film 9, BPSG film 10, source/drain regions 11, and the interconnect layer are formed like the first embodiment, and thus, a non-volatile memory is completed.

In the present embodiment, the dielectric region is formed in the empty space region when forming the interelectrode insulating film 7 by thermal oxidation. However, the method for forming the dielectric region is not limited to thermal oxidation. For example, the dielectric region can be formed in the empty space region when forming the electrode sidewall insulating film 9 by low pressure CVD process.

(Fifth Embodiment)

Figure 18A:
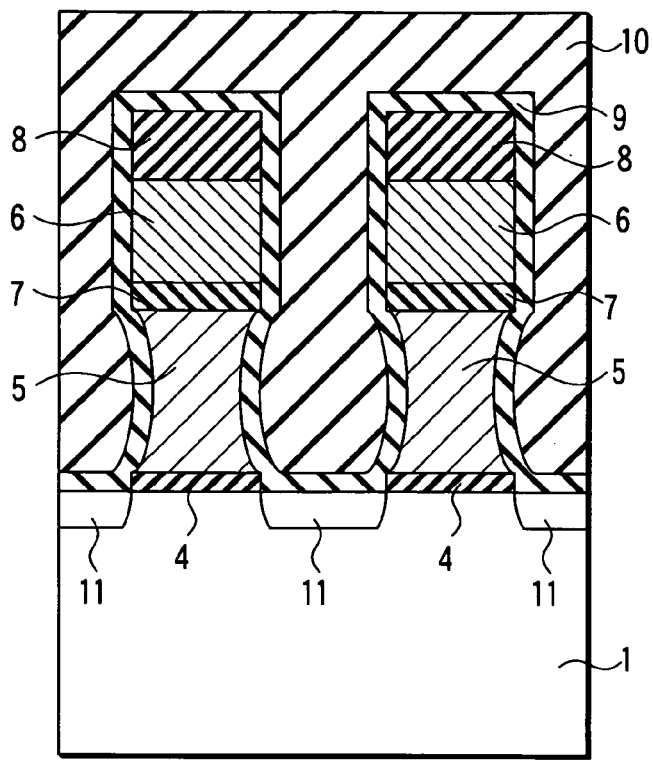
FIG. 18A and FIG. 18B are individually channel length and width direction cross-sectional views showing a plurality of memory cells according to the fifth embodiment of the present invention.
Figure 18B:
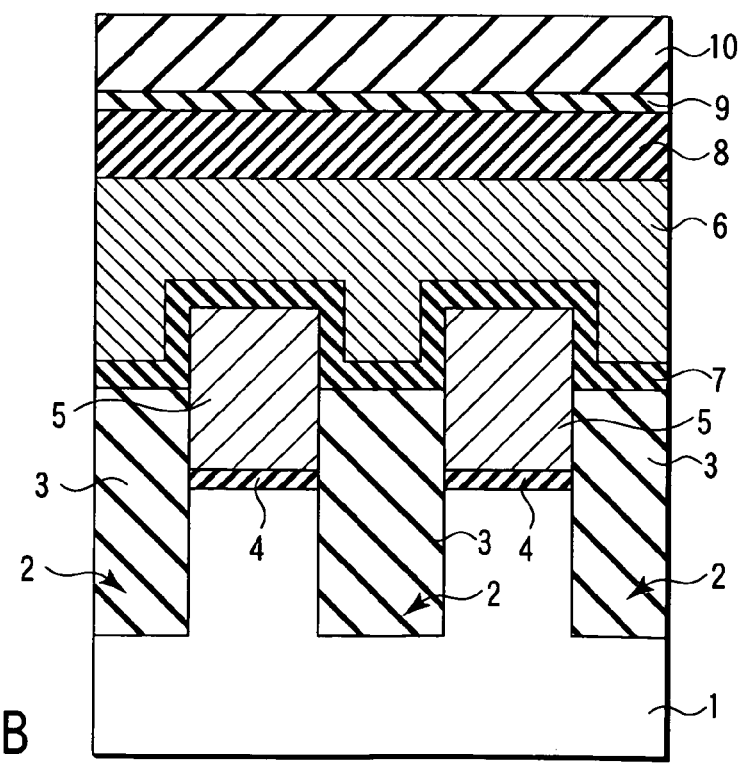

FIG. 18A and FIG. 18B are cross-sectional views showing a plurality of memory cells according to the fifth embodiment of the present invention. FIG. 18A is an equivalent to cross-sectional view taken along a line A–A' of FIG. 1, and FIG. 18B is an equivalent to cross-sectional views taken along a line B–B' thereof.

The fifth embodiment differs from the first embodiment in the following points. The width of the floating gate electrode 5 changes in the height direction of the memory cell in the channel length direction of the memory cell and the floating gate electrode 5 has the thinnest width at the approximately intermediate position between a region above the bottom surface of the floating gate electrode 5 and a region below the upper surface of the floating gate electrode 5.

The position where the width of the floating gate electrode 5 is the thinnest and the change of the width thereof may be variously modified like the first embodiment.

In the channel length direction of the memory cell, the distance between upper surfaces of adjacent floating gate electrodes 5 is the same as the distance between conventional ones. Likewise, the distance between lower surfaces of adjacent floating gate electrodes 5 is the same as the distance between conventional ones. Therefore, the average distance between adjacent floating gate electrodes 5 of the present embodiment is longer than the average distance between conventional ones.

When the average distance between adjacent floating gate electrodes is longer, the parasitic capacitance between adjacent floating gate electrodes 5 is reduced. Therefore, according to the present embodiment, cell interference is effectively prevented even if the scale-down of element is advanced. As a result, it is possible to realize a high integration non-volatile memory, which is hard to cause memory malfunction.

The method of manufacturing a plurality of memory cells of the fifth embodiment will be described with reference to FIG. 19A and FIG. 19B to FIG. 24A and FIG. 24B. FIG. 19A to FIG. 24A are equivalent to cross-sectional views taken along a line A–A' of FIG. 1, and FIG. 19B to FIG. 24B are equivalent to cross-sectional views taken along a line B–B' thereof.

As shown in FIG. 19A and FIG. 19B, the tunnel insulating film 4 having a thickness of 10 nm is formed on the surface of the silicon substrate 1 doped with desired impurity by thermal oxidation. Thereafter, a polysilicon film 5 having a thickness of 150 nm and doped with phosphorus to be processed into the floating gate electrode is deposited on the tunnel insulating film 4 by low-pressure CVD process using silane and phosphine gases. The polysilicon film 5 has the same phosphorus concentration gradient (concentration distribution) as the first embodiment.

Next, as illustrated in FIG. 19A and FIG. 19B, the following films are successively deposited on the polysilicon film 5 by low-pressure CVD process. One is a silicon nitride film 12 having a thickness of 50 nm to be processed into a CMP stopper. Another is a silicon oxide film 13 having a thickness of 100 nm to be processed into an RIE mask.

Next, as depicted in FIG. 19A and FIG. 19B, the silicon oxide film 13 is etched by RIE process using resist (not shown) covering the element forming region. By doing so, the resist pattern is transferred to the silicon oxide film 13.

Next, as seen from FIG. 19A and FIG. 19B, silicon nitride film 12, polysilicon film 5 and tunnel insulating film 4 are successively etched by RIE process using the resist mask and the silicon oxide film 13 as the mask, further, the exposed region of the silicon substrate 1 is etched so that an isolation trench 2 can be formed.

The resist disappears in the RIE process, thereafter, the silicon oxide film 13 is used as the RIE mask.

Next, as shown in FIG. 19A and FIG. 19B, a silicon oxide film (CVD oxide film) having a thickness of 400 nm to be processed into the isolation film 3 is deposited on the entire surface by plasma CVD processed so that the isolation trench 2 is fully filled.

Next, as depicted in FIG. 20A and FIG. 20B, unnecessary portions of the CVD oxide film are removed by CMP process using the silicon nitride film 12 as the CMP stopper. By doing so, the isolation film 3 having a predetermined shape is obtained, and the silicon oxide film 13 (RIE mask) 13 is removed. The CMP process is carried out until the silicon nitride film 12 is exposed and the surface is planarized.

Next, as seen from FIG. 21A and FIG. 21B, the silicon nitride film 12 is removed by etching using phosphoric acid solution. Thereafter, the upper portion of the isolation film (silicon oxide film) 3 is removed by wet etching using diluted hydrofluoric acid solution. By doing so, the upper portion of the side of the floating gate electrode 5 is exposed.

Next as shown in FIG. 22A and FIG. 22B, a three-layer structure insulating film having a thickness of 15 nm and comprising a silicon oxide film, a silicon nitride film and a silicon oxide film to be processed into the interelectrode insulating film 7 is deposited on the entire surface by low-pressure CVD.

Next, as illustrated in FIG. 22A and FIG. 22B, a two-layer structure conductive film having a thickness of 100 nm and comprising a polysilicon film, and a tungsten silicide film to be processed into the control gate electrode 6 is deposited on the three-layer structure insulating film by low-pressure CVD.

Next, a silicon nitride film to be processed into an RIE mask and having a thickness of 100 nm is formed on the two-layer structure conductive film by low-pressure CVD process.

Next, a resist mask is formed on the silicon nitride film, and the silicon nitride film is etched by RIE process using the resist mask as the mask. By doing so, the silicon nitride film 8 having the pattern corresponding to the gate structure portion is obtained as seen from FIG. 22A and FIG. 22B.

Next, the two-layer structure conductive film, three-layer structure insulating film, the floating gate electrode 5, and the tunnel insulating film 4 are successively etched by RIE process using the resist mask and the silicon nitride film 8 as the mask, and as depicted in FIG. 22A and FIG. 22B, a slit 15 is formed in the word line direction. By doing so, the shape of the floating gate electrode 5 and the control gate electrode 6 is defined.

Next, as depicted in FIG. 23A and FIG. 23B, silicon oxide films 14*a* and 14*b* are formed on the surfaces of the exposed silicon substrate and the floating gate electrode 5 by thermal oxidation.

The film thickness of the silicon oxide film 14b on the sidewall of the polysilicon film 5 doped with phosphorus becomes thicker as the concentration of the phosphorus increase, and the film 14*b* has a thickness of 10 nm at the highest phosphorus concentration, that is, the approximately intermediate position in the thickness direction.

The reason why the silicon oxide film 14*b* is formed having the film thickness distribution described above is because enhanced oxidation by phosphorus occurs on the sidewall of the polysilicon film 5.

Next, as seen from FIG. 24A and FIG. 24B, the silicon oxide films 14*a* and 14*b* are removed by wet etching using diluted hydrofluoric acid solution.

As a result, the floating gate electrode 5 is obtained having the following width in the channel length direction of the memory cell. Namely, the width becomes thinnest at the approximately intermediate position between a region above the bottom surface of the floating gate electrode 5 and a region below the upper surface thereof. In addition, the width non-linearly increases toward the upper and lower surfaces of the floating gate electrode 5 from the position where the width becomes thinnest.

Thereafter, the silicon oxide film (electrode sidewall oxide film) 9 is formed using thermal oxidation and CVD process, the source/drain regions 11 are formed using ion implantation and annealing, and the interlayer insulating film as the BPSG film 10 is deposited by low-pressure CVD like the first embodiment, thereby the memory cell shown in FIG. 18A and FIG. 18B is obtained. Thereafter, well-known process such as interconnect forming process is carried out, and thus, a non-volatile memory is completed.

(Sixth Embodiment)

Figure 25:
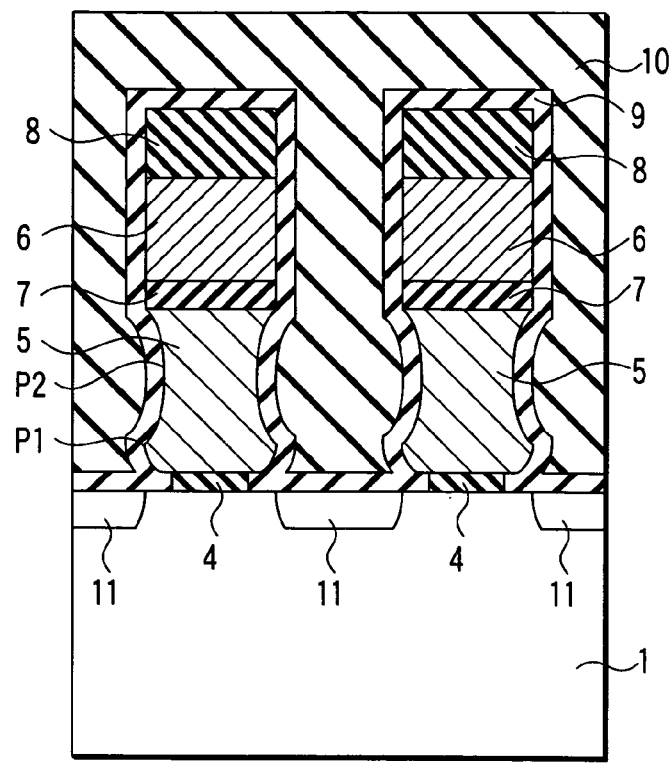
FIG. 25 is a channel length direction cross-sectional view showing a plurality of memory cells according to the sixth embodiment of the present invention.

FIG. 25 is a cross-sectional view showing a plurality of memory cells according to the sixth embodiment of the present invention. FIG. 25 is a channel length direction cross-sectional view corresponding to FIG. 2A.

The sixth embodiment differs from the fifth embodiment in the following points. Namely, the area of the tunnel insulating film 4 facing the floating gate electrode 5 is smaller than that of the interelectrode insulating film 7 facing the floating gate electrode 5.

In addition, the width of the floating gate electrode 5 has the following distribution in the height direction of the memory cell. Namely, the floating gate electrode 5 has the maximum width at a position P1 separating from the bottom surface of the floating gate electrode 5 with a predetermined distance. In addition, the floating gate electrode 5 has the minimum width at a position P2 (position where the floating gate electrode 5 is thinnest) above the position P1.

According to the present embodiment, the following effect is obtained in addition to the effect described in the fifth embodiment. Namely, the area of the tunnel insulating film 4 facing the floating gate electrode 5 is smaller than that of the interelectrode insulating film 7 facing the floating gate electrode 5. This serves to realize the reduction of operating voltage by an increase of coupling ratio.

The method of manufacturing a plurality of memory cells of the present embodiment slightly differs from that of the fifth embodiment.

The difference point between the present embodiment and the fifth embodiment is as follows. Time spent for wet etching using diluted hydrofluoric acid solution is made long in the process of FIG. 23. The edge of the tunnel insulating film 4 is etched by about 10 nm in the channel length direction, and thereafter, thermal oxidation is again carried out.

The first to sixth embodiments have described the following memory cell structure. In one of the channel width and length directions, the width of the floating gate electrode 5 changes in the height direction of non-volatile memory cell. In addition, the width is the thinnest at the intermediate position between the region above the bottom surface of the floating gate electrode 5 and the region below the upper surface thereof. The width of the floating gate electrode 5 can be changed in both channel width and length directions, as described above.

(Seventh Embodiment)

Figure 26:
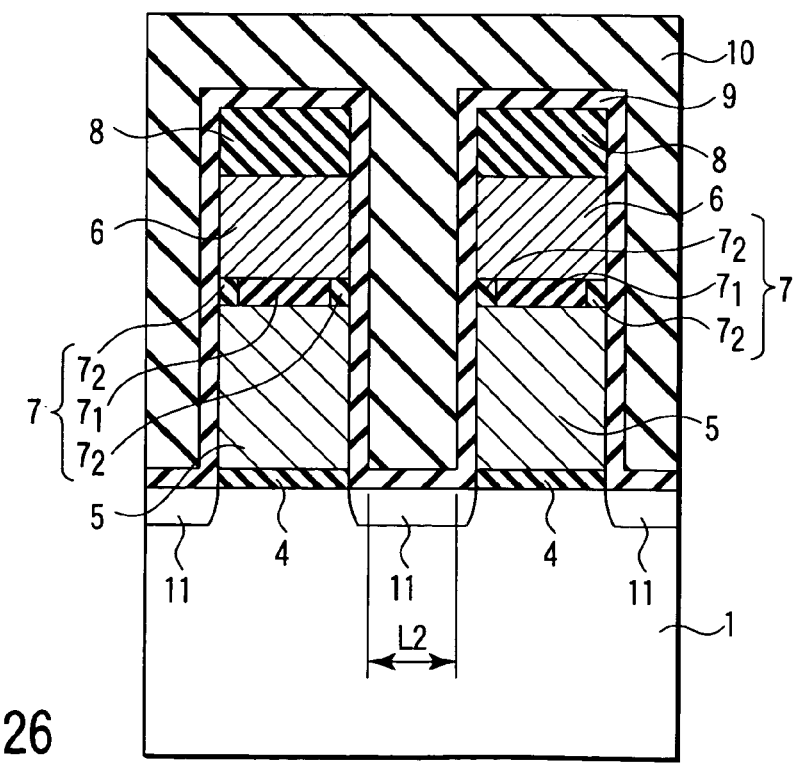
FIG. 26 is a channel length direction cross-sectional view showing a plurality of memory cells according to the seventh embodiment of the present invention.

FIG. 26 is a cross-sectional view showing a plurality of memory cells according to the seventh embodiment of the present invention. FIG. 26 is a channel length direction cross-sectional view corresponding to FIG. 2A.

The seventh embodiment differs from the first embodiment in the following points. The interelectrode insulating film 7 includes a first dielectric region $7_1$ and a second dielectric region $7_2$ having permittivity lower than the first dielectric region $7_1$. In addition, in the channel length direction of the memory cells, the second dielectric region $7_2$ is provided on the edge of the first dielectric region $7_1$ in the channel length direction of the non-volatile memory cell.

The first dielectric region $7_1$ comprises alumina or tantalum oxide; on the other hand, the second dielectric region $7_2$ comprises silicon oxide (SiO$_2$), silicon nitride (SiN) or silicon oxynitride (SiON). In this case, the width of the floating gate electrode 5 can be changed like the first to sixth embodiments.

The width of the floating gate electrode 5 has no change in the height direction of the memory cell in any of the channel length and width directions.

Figure 27A:
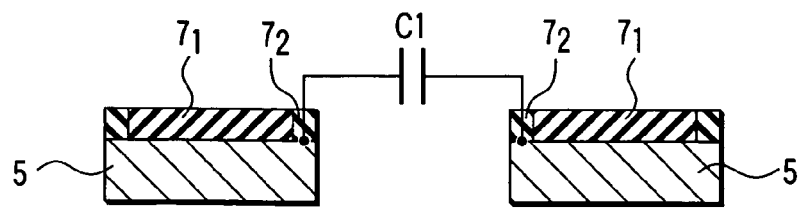
FIG. 27A and FIG. 27B are views schematically showing parasitic capacitance of the memory cell according to the sixth embodiment.

The scale-down of the memory cell is advanced, and thereby, the distance L2 between floating gate electrodes 5 becomes shorter. When the distance L2 becomes shorter, the parasitic capacitance C1 between upper surfaces of adjacent floating gate electrodes 5 shown in FIG. 27A becomes larger in general.

Figure 27B:
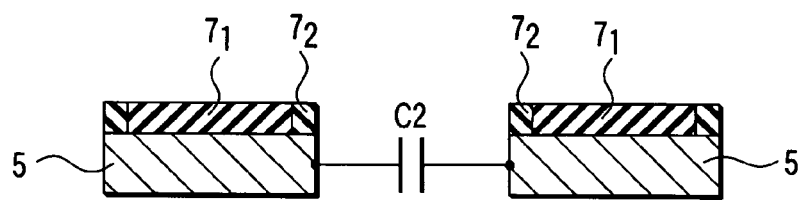

However, according to the present embodiment, the second dielectric region $7_2$ having low permittivity exists on the upper surface of the edge of the floating gate electrode 5. Therefore, an increase of the parasitic capacitance C1 is effectively prevented even if the scale-down of the memory cell is advanced. The parasitic capacitance C2 (see FIG. 27B) between sidewalls of adjacent floating gate electrodes 5 is the same as the conventional case.

According to the present embodiment, the factor of memory malfunction, that is, cell interference is prevented even if the scale-down of elements is advanced. As a result, it is possible to realize a high integration non-volatile memory, which is hard to cause memory malfunction.

The method of manufacturing the memory cell of the present embodiment is as follows. The processes described in FIG. 19A and FIG. 19B to FIG. 22A and FIG. 22b of the sixth embodiment are carried out. The interelectrode insulating film 7 (equivalent to first dielectric region $7_1$ of the present embodiment) is alumina film or tantalum oxide film.

The edge of the interelectrode insulating film 7 is removed by a predetermined amount (dimension equivalent to the width of second dielectric region $7_2$) in the channel direction by RIE process or wet etching. By doing so, the first dielectric region $7_1$ is formed.

Thereafter, the region where the interelectrode insulating film 7 is removed is filled with dielectrics having low permittivity, such as silicon oxide by CVD process, and thereby, the second dielectric region $7_2$ is obtained.

Thereafter, well-known processes, that is, processes of forming electrode sidewall oxide film 9, source/drain regions 11, and BPSG film (interlayer insulating film) 10 are carried out. In this manner, the memory cell shown in FIG. 26A and FIG. 26B is obtained. Thereafter, the process of forming interconnect layer is carried out, and thus, a non-volatile memory is completed.

Incidentally, the region where the interelectrode insulating film 7 is removed is filled with the BPSG film (interlayer insulating film) 10, and thereby, the second dielectric region $7_2$ can be formed. In this case, the process can be simplified because of omitting the process of filling the region where the inter-electrode insulating film 7 is removed with dielectrics such as silicon oxide.

(Eighth Embodiment)

Figure 28:
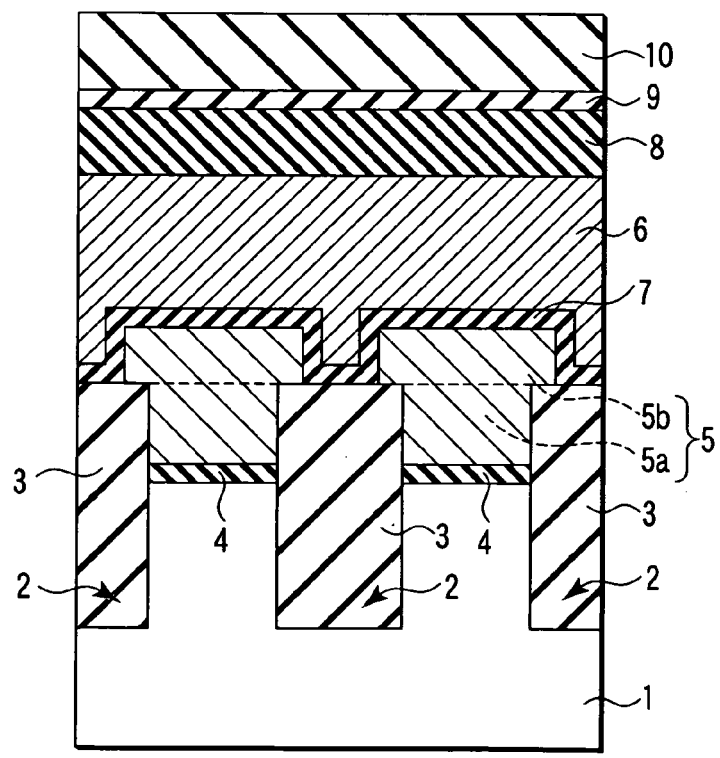
FIG. 28 is a channel width direction cross-sectional view showing a plurality of memory cells according to the eighth embodiment of the present invention.
Figure 29:
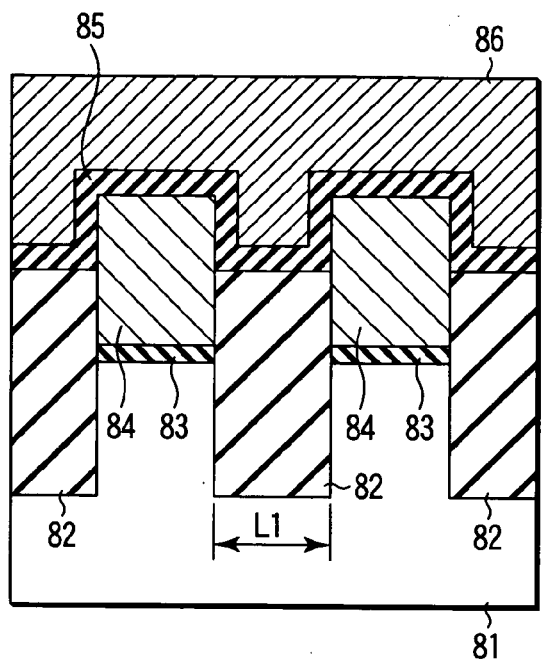
FIG. 29 is a cross-sectional view showing the structure of a conventional memory cell in a channel width direction.
Figure 30:
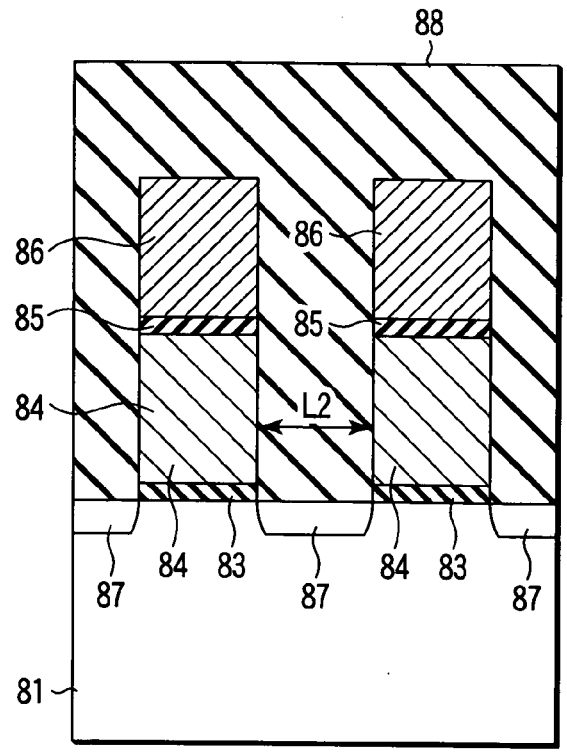
FIG. 30 is a cross-sectional view showing the structure of a conventional memory cell in a channel length direction.
Figure 31A:
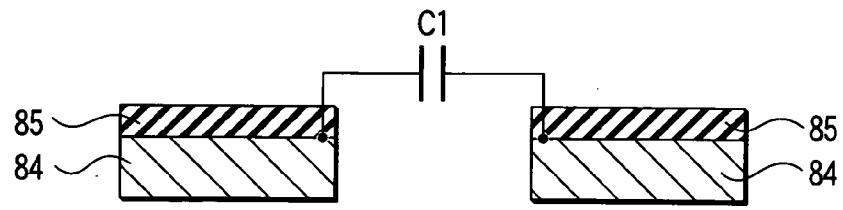
FIG. 31A and FIG. 31B are views schematically showing parasitic capacitance of the conventional memory cell.
Figure 31B:
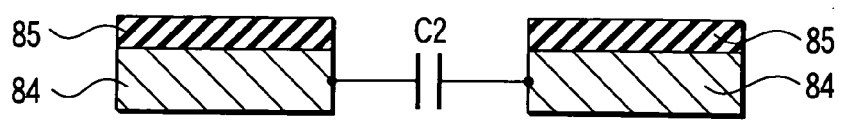

FIG. 28 is a cross-sectional view showing a plurality of memory cells according to the eighth embodiment of the present invention. FIG. 28 is a channel width direction cross-sectional view corresponding to FIG. 2B.

The eighth embodiment differs from the seventh embodiment in the following point. The area of the tunnel insulating film 4 facing the floating gate electrode 5 (5a, 5b) is smaller than that of the interelectrode insulating film 7 facing the floating gate electrode 5.

According to the present embodiment, the following effect is obtained in addition to the effect described in the seventh embodiment. Namely, the area of the tunnel insulating film 4 facing the floating gate electrode 5 is smaller than that of the interelectrode insulating film 7 facing the floating gate electrode 5 in the present embodiment. Therefore, it is possible to realize the reduction of operating voltage by an increase of coupling ratio.

The method of manufacturing a plurality of memory cells of the present embodiment is the same as the seventh embodiment excepting the process of forming the floating gate electrode 5 (5a, 5b). The process of forming the floating gate electrode 5a, 5b is as follows.

The process of forming the floating gate electrode 5a, 5b includes the following processes, like the process of FIG. 21A and FIG. 21B of the fifth embodiment. One is a step of forming the floating gate electrode (equivalent to the floating gate electrode 5a of the present embodiment). Another is a step of forming a polysilicon film on regions including the isolation film 3 and the floating gate electrode 5a. Another is a step of processing the polysilicon film by photolithography and etching to form the floating gate electrode 5b including the polysilicon film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate provided with an isolation trench filled with an isolation film; and
a plurality of non-volatile memory cells provided on the semiconductor substrate, each of the plurality of non-volatile memory cells comprising:
a tunnel insulating film provided on the semiconductor substrate;
a floating gate electrode provided on the tunnel insulating film, the width of the floating gate electrode changing in the height direction of the non-volatile memory cell in a channel width direction, and being thinnest between a region above the bottom surface of the floating gate electrode and a region below the upper surface thereof;
a control gate electrode above the floating gate electrode; and
an interelectrode insulating film provided between the control gate electrode and the floating gate electrode,
wherein the plurality of non-volatile memory cells includes a first non-volatile memory cell including a first floating gate electrode and a second non-volatile memory cell, adjacent to the first non-volatile memory cell, including a second floating gate electrode, the isolation film covers lower side portions of the first and second floating gate electrodes in the channel width direction, and the widths of the first and second floating gate electrodes gradually increase, in the channel width direction, toward the lower surfaces of the first and second floating gate electrodes from the upper surface of the isolation film.

2. The semiconductor device according to claim 1, wherein the width of the floating gate electrode is the thinnest at an approximately intermediate position between the region above the bottom surface of the floating gate electrode and the region below the upper surface thereof.

3. The semiconductor device according to claim 1, wherein the width of the floating gate electrode gradually increases toward the upper and lower surfaces of the floating gate electrode from the position where the width of the floating gate electrode is the thinnest.

4. The semiconductor device according to claim 2, wherein the width of the floating gate electrode gradually increases toward the upper and lower surfaces of the floating gate electrode from the position where the width of the floating gate electrode is the thinnest.

5. The semiconductor device according to claim 3, wherein the width of the floating gate electrode nonlinearly increases.

6. The semiconductor device according to claim 4, wherein the width of the floating gate electrode nonlinearly increases.

7. The semiconductor device according to claim 1, wherein among the upper surface and a side surface of the floating gate electrode, the upper surface thereof is coated with the interelectrode insulating film.

8. The semiconductor device according to claim 2, wherein among the upper surface and a side surface of the floating gate electrode, the upper surface thereof is coated with the interelectrode insulating film.

9. The semiconductor device according to claim 3, wherein among the upper surface and a side surface of the floating gate electrode, the upper surface thereof is coated with the interelectrode insulating film.

10. A semiconductor device according to claim 1, wherein the width of the floating gate electrode in channel length direction is substantially uniform.

11. A semiconductor device according to claim 1, wherein the width of the part of the side portion is thinner than a bottom width of the first floating gate electrode.

12. A semiconductor device according to claim 1, wherein the floating gate electrode includes a top surface which is higher than that of the isolation film in the channel width direction.

13. A semiconductor device according to claim 1, wherein the isolation film further covers upper side portions of the first and second floating gate electrodes in the channel width direction, widths of the first and second floating gate electrodes in the channel width direction are the thinnest at an approximately intermediate position in a height direction of the first and second floating gate electrodes, and the widths of the first and second floating gate electrodes gradually increase toward bottom side and top side surfaces of the first and second floating gate electrodes from the intermediate position.

* * * * *